United States Patent [19]

Dobrovolny

[11] Patent Number: 4,464,636

[45] Date of Patent: Aug. 7, 1984

[54] WIDEBAND IF AMPLIFIER WITH COMPLEMENTARY GAAS FET-BIPOLAR TRANSISTOR COMBINATION

[75] Inventor: Pierre Dobrovolny, North Riverside, Ill.

[73] Assignee: Zenith Electronics Corporation, Glenview, Ill.

[21] Appl. No.: 455,724

[22] Filed: Jan. 5, 1983

[51] Int. Cl.³ ............................................. H03F 3/16
[52] U.S. Cl. .................................... 330/300; 330/304; 330/306; 358/188; 455/190; 455/253; 455/340
[58] Field of Search .............. 330/277, 300, 304, 306; 358/174, 184, 188; 455/190, 253, 340

[56] References Cited

U.S. PATENT DOCUMENTS 4,277,757 7/1981 Kennedy ........................... 330/300

OTHER PUBLICATIONS

Hastings, M. V., "Testbench Amplifier", *Radio and Elec. Constructor*, vol. 32, No. 8, Apr. 1979, pp. 470–474.

*Primary Examiner*—James B. Mullins
*Assistant Examiner*—Steven J. Mottola

[57] ABSTRACT

A wideband intermediate frequency (IF) amplifier including a GaAs FET input portion and a bipolar transistor output portion is disclosed. The high gain of the GaAs FET over higher frequencies is complemented by the high gain of the bipolar transistors at lower frequencies to provide high amplifier gain over a large bandwidth. The GaAs FET and bipolar portions are coupled by means of an equalizer circuit matching the two portions together only at the higher frequencies of the IF band to provide an inexpensive, high performance IF amplifier particularly adapted for use in a direct broadcast satellite receiver operating in the super high frequency (SHF) band.

9 Claims, 2 Drawing Figures

WIDEBAND IF AMPLIFIER WITH COMPLEMENTARY GAAS FET-BIPOLAR TRANSISTOR COMBINATION

BACKGROUND OF THE INVENTION

This invention relates generally to intermediate frequency (IF) signal amplifiers and is particularly directed to a gain equalized intermediate frequency signal amplifier utilizing a combination of bipolar and field effect transistors.

An intense effort is currently under way to develop a low cost, high performance television system which utilizes satellites in geosynchronous orbit to relay signals from earth-based transmitting stations to small receivers owned or leased by individual television viewers. This system offers the advantages of availability in remote locations as well as increased frequency band capability to permit the transmission of a large number of programs in addition to that available via terrestrial television signal transmission.

The satellite television signals are generally transmitted in the super high frequency (SHF) band because of the favorable propagation characteristics at these frequencies and the relatively small size of components used for processing signals at these frequencies. Each satellite receiver includes a remotely located low noise outdoor unit comprised primarily of a frequency down converter connected to a dish antenna and an indoor unit comprised primarily of a channel selecting portion and an FM demodulating portion. The outdoor unit is typically mounted at the focal point of the parabolically-shaped dish antenna and converts the SHF ($\sim 12$ GHz) input signal to a UHF ($\sim 1$ GHz) intermediate frequency signal where it is amplified in an IF amplifier to a level high enough to overcome the losses in the coaxial cable connecting the outdoor unit with the viewer's indoor unit. The IF frequency band may cover several hundred megahertz, with a required gain of 30 dB or more and a noise figure of 2 dB or better.

With these performance criteria in mind, IF amplifiers may be categorized in terms of four general areas. These areas are briefly outlined in the following paragraphs.

A. Technology level of the manufacturing process:
  1. Packaged discrete device level with the discrete devices mounted on a printed circuit (PC) board together with various passive devices also in discrete form;
  2. Hybrid circuit level utilizing either thick or thin film technology, usually with active elements in chip form bonded to the conductors on the substrate and possibly with some discrete passive chip components added to the circuit; or
  3. Monolithic circuit level with all active and passive elements implemented by means of special processing methods on a single chip.

B. Basic semiconductor material the active device is made from:
  1. Silicon; or
  2. Gallium arsenide.

C. The number of discrete inductive circuit elements, adjustable or nonadjustable, used for tuning, matching and compensation:
  1. None;
  2. A Few; or
  3. Many.

D. Price:
  1. Inexpensive; or
  2. Expensive.

While, for example, in the military sector the typical dominating factor is performance, in the consumer electronics sector the typical dominating factor is price and obviously the emphasis is therefore on optimum performance at the lowest possible price.

While IF amplifiers built on the monolithic circuit level are at the present time still in the laboratory stage (Monolithic Circuits Symposium—digest of papers June 1982, IEEE Catalog No. 82CH1784-8), and not readily available, amplifiers made as hybrid circuits are available off the shelf. For example, Watkins-Johnson offers an extensive line of products of this kind. Unfortunately, the price of a hybrid IF amplifier is for TV manufacturers prohibitive, unless the entire receiver, i.e., SHF and IF sections, is made on a common substrate in hybrid form with the hybrid approach justified mainly by the need for the SHF section. The last, and probably the least expensive option, is an IF amplifier implemented on a single sided PC board (conductive foil placed only on one side of the dielectric substrate) and with packaged discrete elements. The choice now is between silicon and gallium arsenide (bipolar and GaAs FET) and includes consideration of criterion "C" above. Since a low cost circuit is also a circuit with a minimum of adjustable elements, the tendency would be toward using only capacitively coupled bipolar stages. In actual practice, however, the inherent parasitic capacitances and inductances whether residing in the active devices or due to the PC board pattern and dielectric material make this approach very difficult, if not impossible.

Furthermore, the reactive parasitic elements of the PC board will be present whether silicon or gallium arsenide devices are used so that discrete GaAs FET devices used as active elements in such a PC board based amplifier do not have a very significant advantage over bipolar transistors. In addition, GaAs FET's have another disadvantage in the high Q of their equivalent input and output circuits which makes it more or less impossible at UHF frequencies to obtain a relatively large gain over the IF band in these devices. The other option—inexpensive bipolar transistors—is not as difficult in terms of conjugate matching and provides a reasonable gain at the low end of the IF band, but may have a gain slope of as great as 6 dB/octave.

The present invention contemplates the economical use of both bipolar and GaAs FET devices. In this way, a capacitively coupled second portion of an IF amplifier implemented by means of inexpensive bipolar transistors is compensated for by means of a first GaAs FET portion designed so that it provides its available gain selectively at the high end of the band thus compensating for the limited gain thereover of the bipolar portion. With the proper distribution of the coupling element values, a reasonably flat gain versus frequency curve is provided.

OBJECTS OF THE PRESENT INVENTION

Accordingly, it is an object of the present invention to provide an improved intermediate frequency (IF) signal amplifier having high gain over a large bandwidth.

Another object of the present invention is to provide a high gain, wideband IF amplifier for use in the outdoor unit of a satellite receiver employing low-cost discrete devices.

A further object of the present invention is to provide gain equalization in a wideband IF amplifier without complex interstage impedance matching circuitry.

A still further object of the present invention is to provide an inexpensive IF amplifier particularly adapted for operation at approximately 1 GHz using conventional, inexpensive components and technologies which provides high signal gain over a wide range of frequencies.

BRIEF DESCRIPTION OF THE DRAWINGS

The appended claims set forth these novel features believed characteristic of the invention. However, the invention itself, as well as further objects and advantages thereof, will best be understood by reference to the following detailed description of a preferred embodiment taken in conjunction with the accompanying drawings, in which:

DESCRIPTION OF THE PREFERRED EMBODIMENT

Figure 1:
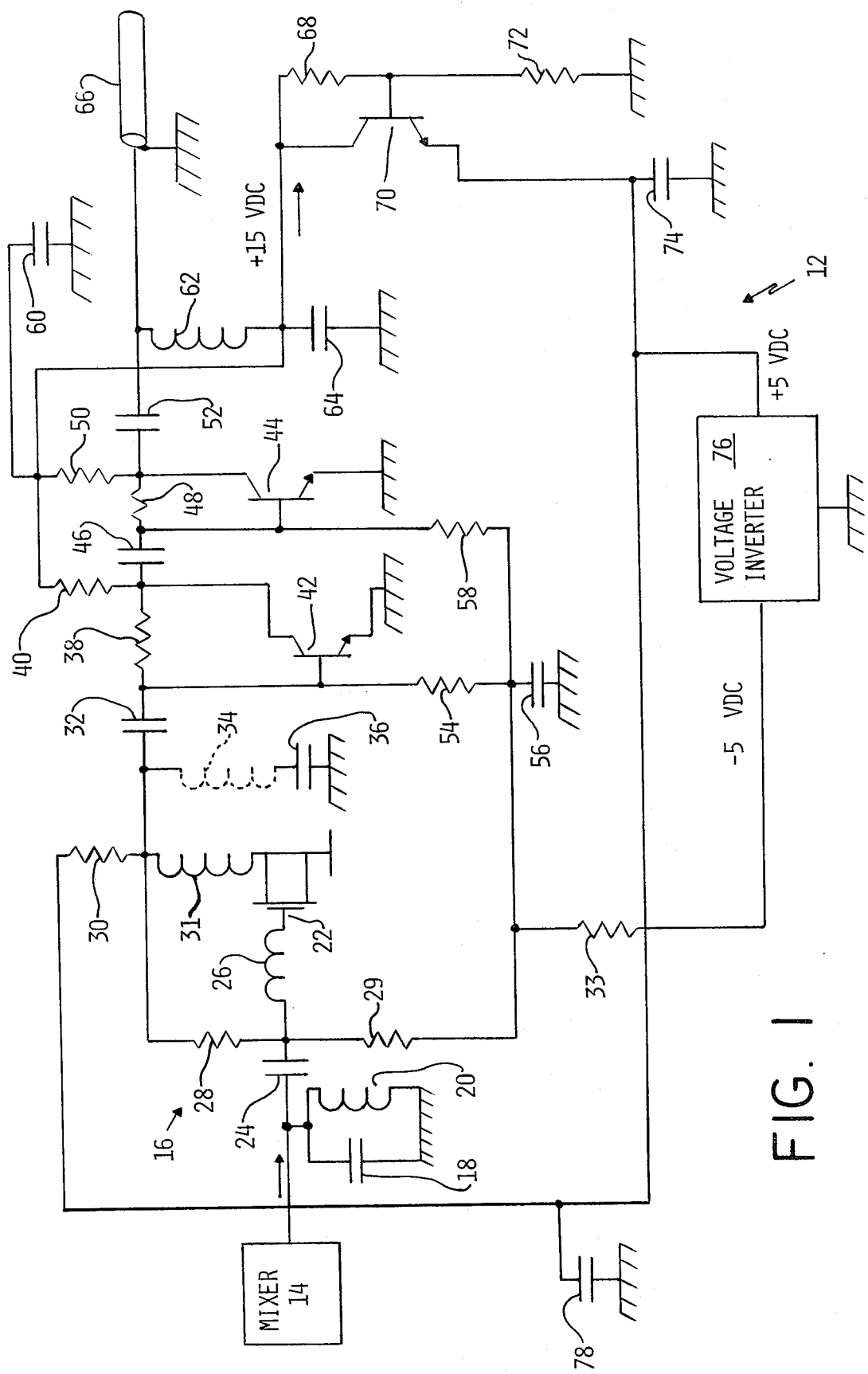
FIG. 1, which is partially in block diagram form and partially in schematic diagram form, shows an IF amplifier circuit in accordance with the present invention.

Referring to FIG. 1, there is shown an IF amplifier circuit 12 in accordance with the present invention.

The IF amplifier circuit 12 in the preferred embodiment depicted in FIG. 1 has a first stage including an N-channel GaAs single gate MES FET and second and third stages which include bipolar NPN transistors 42, 44. All transistors are of an inexpensive type and are provided with a plastic package. The gain of the IF amplifier in the band from 0.75 to 1.25 GHz is approximately 30 dB. The noise figure in that band is approximately 2 dB. The bipolar transistors utilized in a preferred embodiment are Toshiba 2SC2876 transistors and the GaAs FET is a Hitachi HS5367 GaAs FET. The IF amplifier 12 is provided from the indoor unit (not shown) with a DC voltage of approximately +15 VDC through cable 66 which is simultaneously used to provide the amplified IF signal from the outdoor which includes IF amplifier 12 to the indoor unit. The +15 VDC is provided directly to bipolar transistors 42, 44. The +15 VDC is then divided down to approximately +5 VDC by means of emitter follower transistor 70 and a divider network comprised of resistors 68, 72. The +5 VDC is then inverted to −5 VDC by means of a voltage inverter circuit 76. The −5 VDC supply is necessary because bipolar NPN transistors 42, 44 and GaAs FET 22 are utilized respectively in a common emitter and common source configuration, with the emitter directly grounded in the shortest possible way. This configuration is utilized in order to keep the feedback caused by the common electrode inductance of the active devices as low as possible. Thus, the −5 VDC supply provides proper biasing and DC feedback for all active devices in the IF amplifier 12 over the large temperature range the outdoor unit is typically exposed to. The DC feedback also compensates for the effects of component aging.

The +15 VDC voltage provided to bipolar transistors 42, 44 is reduced by collector resistors 40, 50 to the quiescent collector voltages. The DC feedback loop for stabilizing the current of bipolar transistors 42, 44 is closed by means of divider networks comprised respectively of resistors 38, 54 and 48, 58. The +5 VDC voltage provided to GaAs FET 22 is reduced across drain resistor 30 to the quiescent drain voltage. The DC feedback circuit for the GaAs FET 22 is closed by means of a divider network comprised of resistors 28, 29.

Low inductance RF blocking capacitors 60, 64 are used in the +15 VDC supply line. Also, RF blocking capacitors 56, 74 and 78 are provided in the +5 and −5 VDC supply lines. There is no significant voltage drop across resistor 33 which decouples the RF and voltage inverter portions of IF amplifier 12.

The IF output of mixer circuit 14 provides the IF input signal which represents a signal shifted downward in frequency from the received microwave signal. This frequency shifting is accomplished within the mixer circuit 14 by heterodyning, or mixing, the incoming microwave (RF) signal received from the antenna/-preamplifier (not shown) of the preceding section of the receiver with a stable signal from a local oscillator (also not shown) with the local oscillator (LO) frequency being below the RF frequency.

In a preferred embodiment of the present invention, a received RF signal of approximately 12 GHz and a fixed 11 GHz local oscillator signal are provided to mixer circuit 14. This results in the generation of an IF band around 1 GHz. Both sum and difference frequency components are generated when the local oscillator and RF frequencies are mixed, with only the difference component, or the IF signal, provided to IF amplifier 12 from mixer 14. The mixer output impedance is noise-matched with the GaAs FET device 22 through bandpass filter 16 implemented by means of a parallel shunt combination of capacitor 18 and inductor 20 and a series combination of capacitor 24 and inductor 26. The parallel and series resonant circuits of the bandpass filter 16 are both resonant near the IF center frequency. In addition to noise matching, bandpass filter 16 also to some extent suppresses any spurious signals adjacent to the IF band. Furthermore, this bandpass filter configuration is selected to absorb the equivalent series capacitance of the input circuit representing the noise matching. The approximate equivalent input circuit of an FET with low feedback between its input and output ports may be represented at frequencies around 1 GHz with a series combination of a resistor and capacitor. The Q of this capacitor-resistor combination is quite high, rendering a wideband optimum impedance (gain) match between any source and the FET input relatively difficult. Fortunately, the Q for the equivalent noise circuit (also a series RC combination), which represents the fictitious RC combination at the FET input which must be matched for optimum noise performance, is lower. It is typically approximately ½ of the equivalent input circuit Q which makes wideband optimum noise matching at the input of the FET more feasible.

The approximate equivalent FET output circuit may, like the input circuit, be similarly represented by a series combination of a resistor and capacitor except that the Q of the former is even higher than the Q of the latter, and it would seem very difficult to overcome the high Q handicap of the FET output if wideband matching is required. This difficulty becomes irrelevant if the FET output circuit is incorporated into an equalizer circuit which corrects for the gain versus frequency slope of another portion of the IF amplifier which is comprised of inexpensive bipolar transistors. By thus combining the input stage of the IF amplifier circuit 12 comprised primarily of GaAs FET 22 with its output impedance matched at the high frequencies with two more stages comprised primarily of bipolar NPN transistors 42, 44, the high gain of the bipolar transistors at lower frequencies complements the relatively low gain of the GaAs FET at these frequencies, while the high gain of the GaAs FET at higher frequencies complements the relatively low gain of the bipolar transistors at these frequencies.

Figure 2:
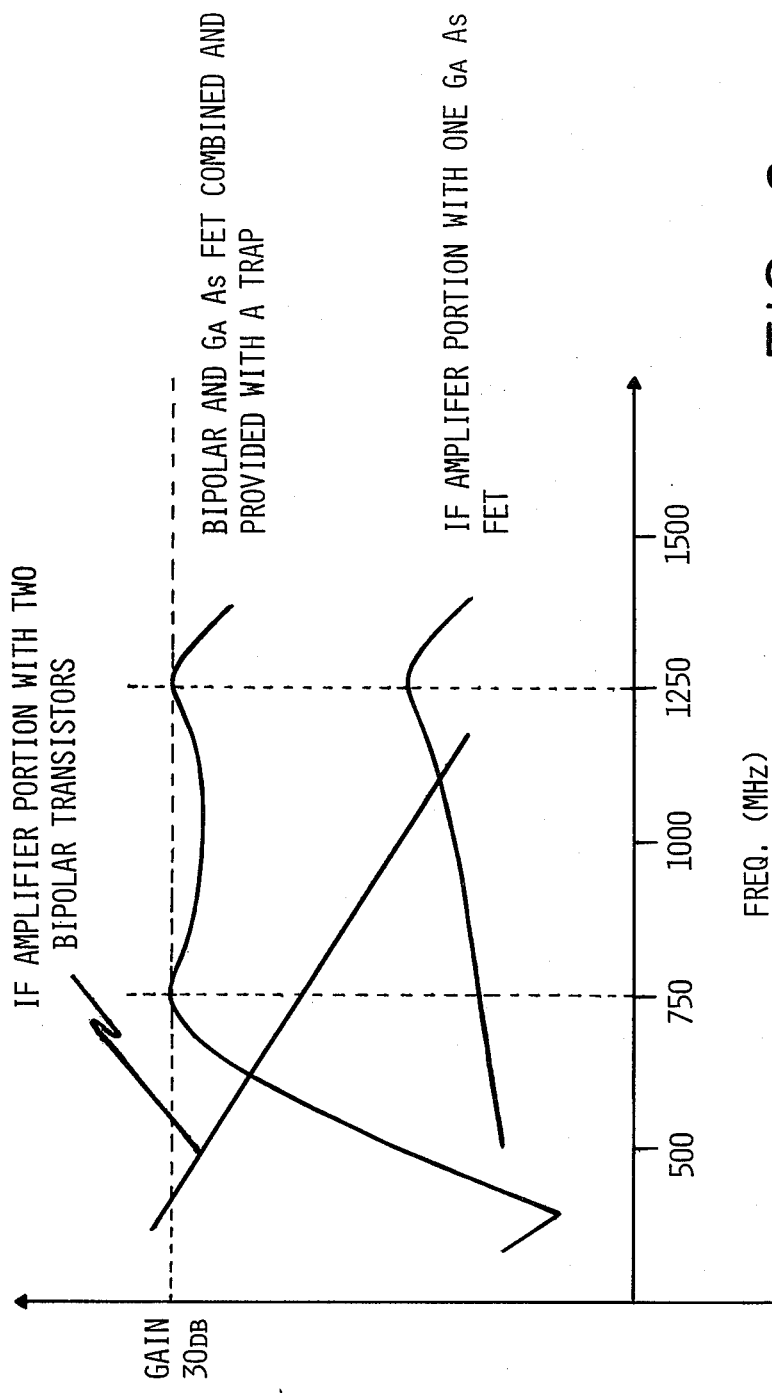
FIG. 2 illustrates frequency versus gain curves characteristic of the active devices utilized in the IF amplifier circuit of FIG. 1 as well as the frequency versus gain curve characteristic of the entire IF amplifier circuit of FIG. 1.

The gain versus frequency response of the GaAs FET portion and the response of the bipolar transistor portion as well as their combined gain versus frequency response is shown in FIG. 2. It must be pointed out, however, that an excessive slope compensation provided by the first stage may result in the degradation of the noise figure of the IF amplifier at the low end of the IF band. The first stage with GaAs FET 22 should have some reasonable residual gain at the low frequency end of the IF band so that the noise contribution of the bipolar portion of the IF amplifier to the IF amplifier noise is negligible at lower frequencies. Thus, the output impedance of the GaAs FET 22 is conjugately matched at the high frequency end of the IF band to the input impedance of the following active device, i.e., transistor 42. This is done essentially by means of inductors 31, 34. Inductor 34 is actually the lead inductance of disc capacitor 36. Capacitor 36 in a preferred embodiment is a disc capacitor having leads of a predetermined length which provide a certain inductance within the series resonant circuit. Thus, capacitor 36 together with its leads forms a series resonant circuit for effective suppression of out-of-band signals around 300 to 400 MHz. Since series resonant circuit 34, 36 resonates well below the IF band, the dominant component of this circuit at the high frequency end of the IF band and also within the IF band itself is inductor 34. The values of coupling capacitors 32, 46 and 52 and of inductor 62 are selected to further optimize the gain versus frequency response of the IF amplifier. Inductor 62 functions also as a DC connection deriving the +15 VDC from the center lead of coaxial cable 66.

Except for the equalizer circuit at the output of GaAs FET 22 and the noise matching bandpass filter at the input of GaAs FET 22 there are no other resonant circuits within IF amplifier 12 which require adjustment, which obviously also keeps the cost of this unit down. The collector resistors 40, 50 and drain resistor 30 do not load the respective collectors of bipolar transistors 42, 44 and the drain of the GaAs FET 22 so that the major portion of the collector and drain admittances is derived from the next stage in each case, and in the case of bipolar NPN transistor 44 from the admittance of the coaxial cable 66 modified by capacitor 52 and inductor 62.

There has thus been shown an IF amplifier having a GaAs FET input amplification stage for frequency response equalization of bipolar output transistor stages. The combination of the GaAs FET and bipolar transistor amplifiers provides a low cost, high gain, wide bandwidth IF amplifier circuit particularly adapted for use in a SHF RF receiver.

While particular embodiments of the present invention have been shown and described, it will be obvious to those skilled in the art that changes and modifications may be made without departing from the invention in its broader aspects and, therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

I claim:

1. A wideband, high gain intermediate frequency (IF) amplifier comprising:
    a first portion having a field-effect transistor input stage wherein gain peaking thereof is at the high frequency end of an IF band;
    a section portion having a plurality of bipolar transistors wherein the frequency versus gain characteristic thereof decreases at the high frequency end of said IF band; and
    an equalization network coupling said first and second portions for matching said first and second portions at said high frequency end of the IF band and wherein said first and second portions are mismatched at lower frequencies in said IF band in providing equalized amplifier gain over a wide frequency band.

2. An intermediate frequency amplifier in accordance with claim 1 wherein said equalization network includes the equivalent output capacitance of said field-effect transistor in combination with capacitive and inductive elements coupling said first and second portions.

3. An intermediate frequency amplifier in accordance with claim 1 further including band pass filter means coupled to said first portion for noise matching said first portion with an input stage coupled to said first portion and providing an IF signal thereto.

4. An intermediate frequency amplifier in accordance with claim 3 wherein said band pass filter means includes a parallel capacitor/inductor input shunt arrangement and a capacitor/inductor output series arrangement.

5. An intermediate frequency amplifier in accordance with claim 1 for use in an outdoor unit of a satellite television receiver wherein said IF band is approximately from 750 to 1250 MHz.

6. An intermediate frequency amplifier in accordance with claim 5 further including an indoor unit including a DC power supply, wherein said indoor and outdoor units are coupled by means of a coaxial cable for providing a DC current to said outdoor unit while providing an amplified IF signal to said indoor unit wherein said DC current and said amplified IF signal are mutually decoupled by means of a DC-IF bypass network.

7. An intermediate frequency amplifier in accordance with claim 1 further including a resistive DC feedback network coupled across said field-effect and bipolar transistors for providing for the temperature compensated operation thereof.

8. In a satellite television receiver wherein super high frequency (SHF) received signals are downconverted to intermediate frequency (IF) signals in the ultra high frequency (UFH) band in a mixer circuit in a SHF section of said satellite television receiver and provided to IF signal processing circuitry in said television receiver, an IF signal amplifier comprising:
    a field-effect transistor amplifier portion coupled to said mixer circuit, said field-effect transistor amplifier portion having higher gain at the high frequency end of said UHF band than over lower frequencies therein;
a discrete bipolar transistor amplifier portion having higher gain over lower frequencies in said UHF band than over the high frequency end thereof; and
a gain equalizing network coupling said field-effect transistor amplifier portion and said bipolar transistor amplifier portion for matching said field-effect transistor amplifier and said bipolar transistor amplifier portions at the high frequency end of said UHF band wherein the resulting gain of said IF signal amplifier is equalized over said UHF band.

9. In a wideband, high gain intermediate frequency (IF) amplifier for use in a super high frequency (SHF) receiver wherein a received SHF signal is downconverted in a mixer to an IF signal in the UHF band, the improvement comprising:
amplifying the IF signal output of said mixer in a field-effect transistor input stage and providing the output therefrom to a bipolar transistor output stage for the further amplification of said IF signal, with the amplified IF signal then provided to the remaider of said SHF receiver wherein said field-effect transistor input stage has a high gain over the high frequency portion of an IF band and the gain of said bipolar transistor output stage decreases at the high frequency end of said IF band, and matching said field-effect transistor input stage and said bipolar transistor output stage for equalizing the gain of said IF amplifier over said IF band.

* * * * *